United States Patent [19]

Fazlin et al.

[11] Patent Number: 4,689,105
[45] Date of Patent: Aug. 25, 1987

[54] MULTI-LAYER PRINTED CIRCUIT BOARD LAMINATION APPARATUS

[75] Inventors: Fazal A. Fazlin; Asad Ali, both of St. Petersburg, Fla.

[73] Assignee: Advanced Plasma Systems Inc., St. Petersburg, Fla.

[21] Appl. No.: 832,860

[22] Filed: Feb. 24, 1986

Related U.S. Application Data

[63] Continuation-in-part of Ser. No. 723,607, Apr. 15, 1985.

[51] Int. Cl.⁴ ............................................. B32B 31/04
[52] U.S. Cl. .................................... 156/382; 156/285
[58] Field of Search ............... 156/103, 104, 105, 285, 156/381, 382; 425/388, 389, 405 R, 411, 504, 506, DIG. 60; 264/101, 531, 571; 53/432, 510

[56] References Cited

U.S. PATENT DOCUMENTS

| | | | |
|---|---|---|---|
| 1,887,565 | 11/1932 | Sherts | 156/104 |
| 2,965,527 | 12/1960 | Morris | 156/104 |
| 3,000,346 | 9/1961 | Hnilicka | 53/510 |
| 3,272,611 | 9/1966 | Jorgensen | 156/104 |
| 3,810,815 | 5/1974 | Welhart et al. | 156/104 |
| 4,596,624 | 6/1986 | Frohlich et al. | 156/382 |

FOREIGN PATENT DOCUMENTS 2023452 7/1982 United Kingdom ............... 156/382

*Primary Examiner*—Caleb Weston
*Attorney, Agent, or Firm*—Dominik, Stein, Saccocio & Reese

[57] ABSTRACT

A lamination apparatus is disclosed which includes serially interconnected loading vacuum chamber, press vacuum chamber and an unloading vacuum chamber. An input transport system is positioned within the loading chamber to transport a printed circuit board book therefrom into the press chamber. An output transport system is likewise positioned in the unloading chamber to remove the printed circuit board book from within the press chamber into the unloading chamber for unloading. The loading and unloading vacuum chambers isolate the press positioned within the press chamber from atmospheric pressure as the printed circuit board books sequentially flow through the lamination apparatus.

9 Claims, 7 Drawing Figures

MULTI-LAYER PRINTED CIRCUIT BOARD LAMINATION APPARATUS

CROSS REFERENCE TO RELATED APPLICATIONS

This application is a continuation-in-part application of Ser. No. 723,607, filed Apr. 15, 1985, the disclosure of which is hereby incorporated by reference herein.

BACKGROUND OF THE INVENTION

1. Field of the Invention

This invention relates to the manufacture of multi-layer printed circuit boards. More particularly, this invention relates to an apparatus and method for laminating the individual printed circuit boards together to produce a multi-layer printed circuit board.

2. Description of the Background Art

Printed circuit boards comprise a sheet or board of electrically resistive material on which is printed a wiring circuit. Various electrical components such as integrated circuits, discrete components and connectors are then soldered to the wiring circuit via holes drilled through the board. Double-sided printed circuit boards comprise a board having a wiring circuit printed on both sides thereof.

Multi-layer printed circuit boards have been developed which comprise individual single- or double-sided printed circuits electrically insulated from one another. Holes are drilled through the board at planned locations to allow interconnection of one printed circuit with one or more of the printed circuits. Drill smear existing on the edges of the hole of the printed circuit is removed either through a wet etch-back process or by the plasma desmearing process disclosed in my previous patent, U.S. Pat. No. 4,425,210, entitled "Plasma Desmearing Apparatus and Method", the disclosure of which is hereby incorporated by reference herein.

After drill smear is removed, the holes are then plated-through to electrically interconnect the individual printed circuits by either electrolytic plating, electroless plating, immersion plating, or plasma plating, as more particularly disclosed in U.S. Pat. No. 4,474,659, entitled "Plated-Through-Hole Apparatus and Method" and the U.S. patent application entitled "Desmearing and Plated-Through-Hole Apparatus and Method filed concurrently herewith and assigned to the same assignee of this application, the disclosures of which are hereby incorporated by reference herein. The multi-layer board is now ready to receive the various electrical components via the holes in the board. After inserting the leads of the components into the holes, the components are soldered to the printed circuits, either individually or by wave soldering techniques.

From the foregoing brief description, it is evident that the manufacture of multi-layer printed circuit boards (MPCB) involves many exacting processes in order to produce a structurally and electrically sound MPCB which meets military and civilian specifications. As set forth hereinafter in more detail, one of the many problems associated with the manufacture of MPCBs is the method for laminating the printed circuit boards to meet such specifications. Usually, failure of the MPCB is the result of improper or inadequate lamination of the layers together which results in, in some areas, insecure lamination during the manufacturing process or actual delamination in the field when the board is in use. Consequently, proper lamination is critical to the successful manufacture of MPCBs.

Presently, there exist many variations in the techniques used to successfully laminate MPCBs. One of the most common techniques for producing MPCBs is to begin with non-conductive boards which are coated on both sides with copper or similar conductive material. Each side of the double-sided board is then coated with an etch-resistant/photo-resist material. Using a photographic negative of the desired printed circuit, the photo-resist is exposed and developed to remove the photo-resist in all areas except for the lines which will constitute the printed circuit. The board is then etched to remove the copper coating in all areas except for such lines, thereby producing copper lines defining the printed circuit. Of course, the printed circuits formed on each side of the double-sided board have been registered with respect to one another. Usually, registration holes are provided to assure that the printed circuits will be registered when the boards are laminated together.

During the actual step of lamination, the boards are stacked on a platen. An epoxy-impregnated, non-conductive woven material, also known as "B" stage, is placed between each adjacent board and then another platen is placed on top of the sandwiched lamination. The woven material is selected having a certain thickness to assure that the printed circuit on one board is electrically isolated from that of the adjacent board. The bottom platen usually includes registration pins which allow the boards to be registered with respect to one another, thereby also registering the printed circuits.

The sandwiched platens/printed circuit boards/epoxy-impregnated woven material, commonly referred to as a "book", is placed into a heated, hydraulic press. The press is then operated to heat and forcibly compress the book to activate and rapidly cure the epoxy contained within the woven material. After curing the epoxy at the desired temperature and pressure, the book is released from the press and, after cooling, the platens are removed revealing the produced MPCB. After drilling the MPCB, the holes in the MPCB are desmeared and then plated-through by one of the processes discussed above. The MPCB is now ready for receiving the electrical components.

In other variations of the lamination method, the book may comprise inner layers composed of single-sided boards, and/or the adhesive layer may comprise epoxy-glass, acrylic, or the products sold under the trademarks "Polyamide", "Kapton", or "Teflon".

One of the most difficult problems associated with the laminating process is the difficulty of properly heating and compressing the layers of boards and epoxy-impregnated woven material together with assurance that the epoxy will be heated to sufficiently flow and make adhesive contact with all areas of the boards as pressure is simultaneously applied. Specifically, under-heating and/or underpressurization may result in some areas never being properly bonded. Conversely, over-heating and/or overpressurization will, typically, result in too much of the epoxy being forced out from between the boards and/or overcompression of the woven material. This will produce a thinner, non-conductive layer which does not electrically isolate the printed circuit on one board from that of the adjacent board. Consequently, the desired electrical properties of non-conductance between printed circuits cannot be assured. Further, so much epoxy may have been forced out from between the boards that delamination in the field will occur due to the lack of optimal bonding strength.

Therefore, it is an object of this invention to provide an apparatus and method which overcomes the aforementioned inadequacies of the prior art and provides an improvement which is a significant contribution to the advancement of multi-layer printed circuit board lamination art.

Another object of this invention is to provide a multi-layer printed circuit board lamination apparatus and method which provides for more precise and consistent lamination of printed circuit boards that which can be obtained by previously known methods.

Another object of this invention is to provide a multi-layer printed circuit board lamination apparatus and method which involves the use of a vacuum chamber to assure that the heating and bonding of the epoxy occurs in a vacuum free of contaminants.

Another object of this invention is to provide a multi-layer printed circuit board lamination apparatus and method in which the lamination is carried out in a vacuum and with adequate pressure being applied to the printed circuit board to assure proper thickness and bonding of the epoxy during the process.

Another object of this invention is to provide a multi-layer printed circuit board lamination apparatus and method which can be accomplished with repeatable accuracy to assure production of multi-layer printed circuit boards in production quantities and meeting the highest specifications.

Another object of this invention is to provide a multi-layer printed circuit board lamination apparatus and method which provides for more precise and consistent lamination of printed circuit boards than that which can be obtained by previously known methods.

The foregoing has outlined some of the more pertinent objects of the invention. These objects should be construed to be merely illustrative of some of the more prominent features and applications of the intended invention. Many other beneficial results can be attained by applying the disclosed method in a different manner or modifying the apparatus and method within the scope of the disclosure. Accordingly, other objects and a fuller understanding of the invention may be had by referring to the summary of the method and the detailed description of the preferred apparatus and method in addition to the scope of the invention defined by the claims taken in conjunction with the accompanying drawings.

SUMMARY OF THE INVENTION

The invention is defined by the appended claims with a specific embodiment shown in the attached drawings. For the purpose of summarizing the invention, the invention comprises a unique lamination apparatus and method for producing multi-layer printed circuit boards. Basically, the method of the invention comprises positioning layers of double- or single-sided printed circuit boards and B stage (or other adhesive layer) between a pair of platens to form a book, as that term is conventionally used in the printed circuits industry. The book is then positioned between a pair of chamber platens within a vacuum chamber. One or both of the chamber platens are operatively connected to a motive means so as to move toward one another to tighten about the book. A position sensor, either opto-electrical or electro-mechanical, is provided to sense the relative spacing between the two chamber platens. The chamber platens are heated by one or more possible heat sources. All of these functions may either be under manual control or controlled by a state-of-the-art computer.

The steps of the method of the invention comprise, first, forming a book of printed circuit boards and layers, as is conventional in the art, and then placing the book between the chamber platens of the vacuum chamber. The lid of the vacuum chamber is closed and the vacuum pump is operated to evacuate the vacuum chamber. Heat is applied to the chamber platens by one of many possible heat sources and the motive means is operated to move the chamber platens together to a prespecified distance apart from one another, depending on the overall thickness of the book. The position sensor determines the relative positions of the chamber platens. When the chamber platens have been moved to the prespecified distance apart, the chamber platens are held at that position while heat is applied to the layers. After a prespecified time period sufficient to melt and cure the epoxy contained within the B stage (or other adhesive layer), the chamber platens are moved apart as atmospheric pressure is restored with the chamber. The book is removed, revealing the newly laminated multi-layer printed circuit board. The process may then be repeated.

One of the most important features of the subject method of the invention is that the lamination is accomplished with a vacuum. In such a vacuum, the great majority of the air which is naturally present between the individual layers of the book is evacuated before the epoxy is activated by the heat. Consequently, all areas of the layers of the book intimately contact one another because of the non-existence of trapped air between such layers. Thus, during activation and curing of the epoxy, a complete bond is assured to be attained between the material and the boards on all surfaces. The weak spots sometimes found in previous lamination methods is, therefore, precluded.

Another significant feature of the method of the invention is the lack of excessive pressure being exerted on the book which would otherwise force out significant amounts of epoxy during the lamination process. More specifically, the method of the invention comprises moving the chamber platens together to a predetermined distance apart from one another, dependent upon the thickness of the book to be laminated. Because of the lack of air between the layers, intimate contact can be assured between the layers of the book when the platens are simply moved to the predetermined, spaced-apart distance. Notably, it becomes unnecessary to continually apply significant pressure on the layers which, as noted earlier, could result in forcing too much epoxy from between the boards such that insufficient bonding is present which will result in delamination in the field.

The apparatus of the invention comprises a vacuum chamber in which is positioned the chamber platens operatively driven by a hydraulic cylinder. The apparatus may be used to accomplish the method of the invention, as described herein, or other presently known lamination methods.

More particularly, the apparatus of the invention comprises a plurality of serially interconnected vacuum chambers preferably including a loading chamber, a press chamber and an unloading chamber. An opening is provided in the common wall of adjacent chambers and each such opening is provided with a remotely operated air-tight door. Another opening is provided in the outside front walls of the loading chamber and the unloading chamber, and each are also provided with an air-tight door. An input transport system is positioned in the loading chamber to transport a printed circuit board book therefrom into the press chamber through the opening in the common wall between loading and press chambers. An output transport system is positioned in the unloading chamber to remove the printed circuit board book from within the press chamber into the unloading chamber via the opening in the common wall between the press and the unloading chambers.

Notably, a vacuum may be created in each chamber independent from the others. Hence, during use on a production line basis, the loading and unloading chambers function to isolate the press chamber from atmospheric pressures, thereby allowing the press chamber to constantly remain at a vacuum free of contaminants. Consequently, the heated press contained within the press chamber can be maintained at a pre-set temperature during each press operation as no significant heat loss will occur from the press chambers as the books are loaded and unloaded into and from the press chamber. Thus, more precise and consistent lamination of the printed circuit boards of the book can be obtained. Further, the thoroughput of the vacuum press is increased while maintaining the repeatable accuracy in the production of the printed circuit boards of the book.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other methods for carrying out the same purposes of the present invention. It should also be realized by those skilled in the art that such equivalent methods do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
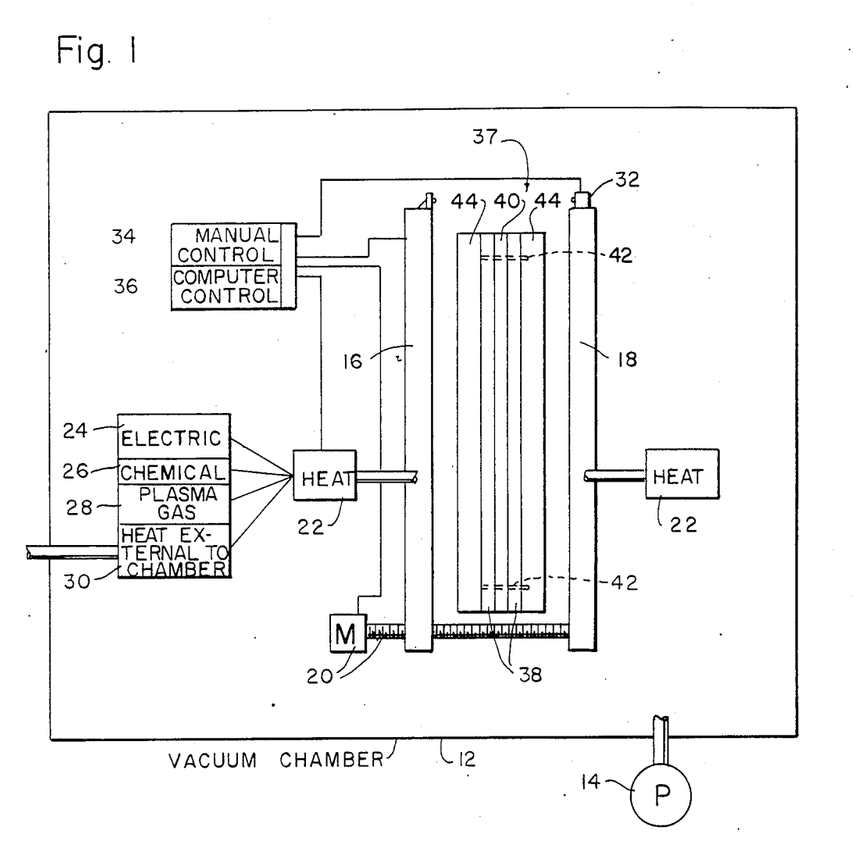
FIG. 1 is a diagrammatical view showing the electrical and mechanical components necessary to accomplish the preferred method of the invention.

FIG. 1 illustrates some of the electrical and mechanical components necessary to accomplish the method of the invention. Basically, the method of the invention is conducted within a vacuum chamber 12 of practically any desired shape or configuration and possibly that disclosed in the patents referenced above. A vacuum pump 14 is provided with appropariate valving to evacuate the chamber. Inside the chamber, two chamber platens 16 and 18 are provided, one or both of which is movable with respect to the other by suitable motive means generaly indicated by the numeral 20. Both of the chamber platens 16 and 18 are heated by a suitable heat source generally indicated by numeral 22. Without limitation, the heat source 22 may include electrical heating such as resistive elements 24, chemical heating 26, heat produced upon the formation of plasma gas 28 or an external heat source 30 fluidly connected to a heat exchanger incorporated within the chamber platens 16 and 18. The relative spacing of the chamber platens 16 and 18 is constantly monitored by means of a position sensor 32 which may be an electro-optical device or an electro-mechanical device without departing from the spirit and scope of this invention. All of the components may be operated under manual control 34 or by computer control 36.

Figure 2:
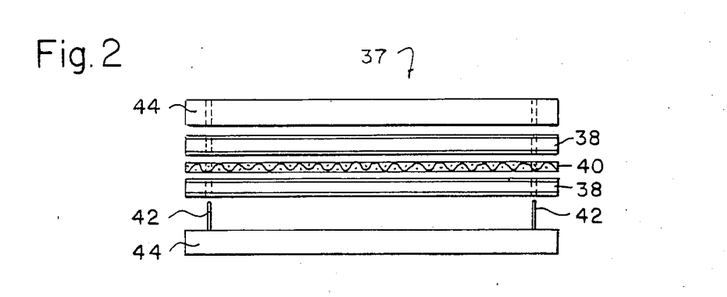
FIG. 2 is a diagrammatical view showing a conventional book composed of double-sided printed circuit boards to be laminated together by means of B stage or other adhesive layers.

FIG. 2 is a diagrammatical view showing a conventional book composed of double-sided printed circuit boards to be laminated together by means of B stage or other adhesive layers. More specifically, conventional books 37 comprise double- or single-sided boards 38 (or layers) which are separated from one another by means of the B stage 40 (or other adhesive layers). The B stage and the other adhesive may comprise any of the presently available materials used in the industry without departing from the spirit and scope of this invention. Moreover, the term "adhesive layer" shall be defined to include all of such materials for the purposes of the claims appended hereto. These layers are placed between a pair of book platens 44 and are registered with respect to one another by means of registration pins 42.

Figure 3:
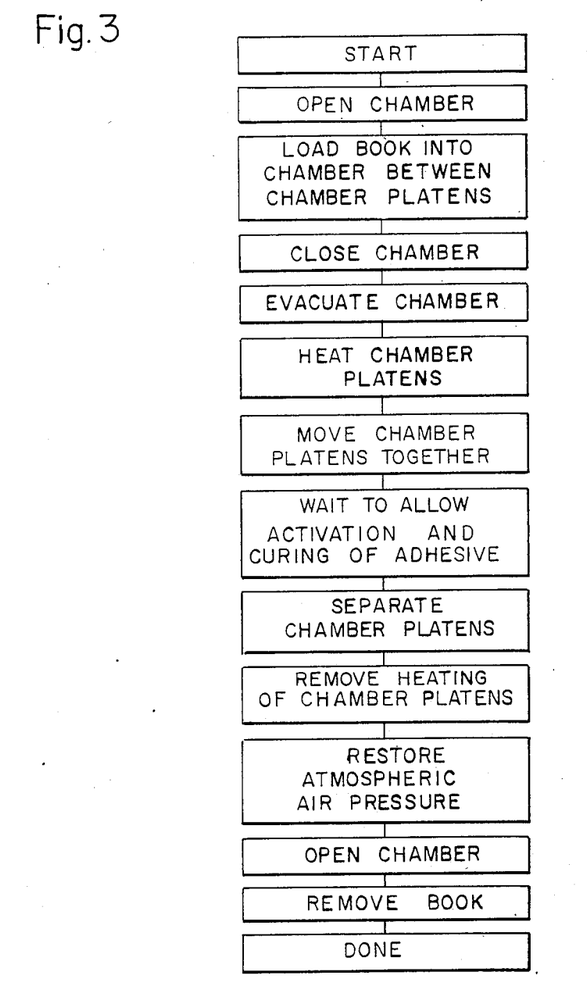
FIG. 3 is a labeled flow chart illustrating the steps of the preferred method of the invention.

Referring to FIG. 3, the method 10 of the invention comprises the steps listed in the flow chart. More particularly, with reference also to FIG. 1, the method of the invention comprises the steps of opening the chamber 12 and then loading the book 37 between the pair of chamber platens 16 and 18.

Once the book 37 is properly loaded into the chamber 12, the lid (not shown) of the chamber 12 is closed and the chamber 12 is evacuated by means of pump 14. The chamber platens 16 and 18 are heated by means of heat source 22 until a desired temperature is attained. In this regard, temperature sensors 46 are provided to accurately sense the actual temperature of the chamber platens 16 and 18. Before, during or after the heating of the chamber platens 16 and 18, the chamber platens 16 and 18 are moved together by motive means 20 until they are a prespecified distance apart. Position sensor 32 is provided to accurately determine such prespecified distance and to feedback such information to computer 36 or to the operator if operated under manual control 34. The prespecified distance is determined according to the thickness of the book 37.

After activation and curing of the epoxy contained within the epoxy-impregnated material (or other adhesive material being used), the chamber platens 16 and 18 are separated by motive means 20. The supply of heat 22 to the chamber platens 16 and 18 is discontinued, and chamber 12 is returned to atmospheric pressure. The chamber 12 is opened and the newly laminated multi-layer printed circuit board is removed. The process is then repeated to produce another laminated multi-layer printed circuit board.

It is noted that, without departing from the spirit and scope of this invention, many MPCBs can be produced at the same time within the chamber by actually producing two or more MPCBs between the pair of chamber platens 16 and 18, by providing additional pairs of platens, and/or by ganging the platens such that one or more MPCBs are produced between adjacent platens.

Figure 4:
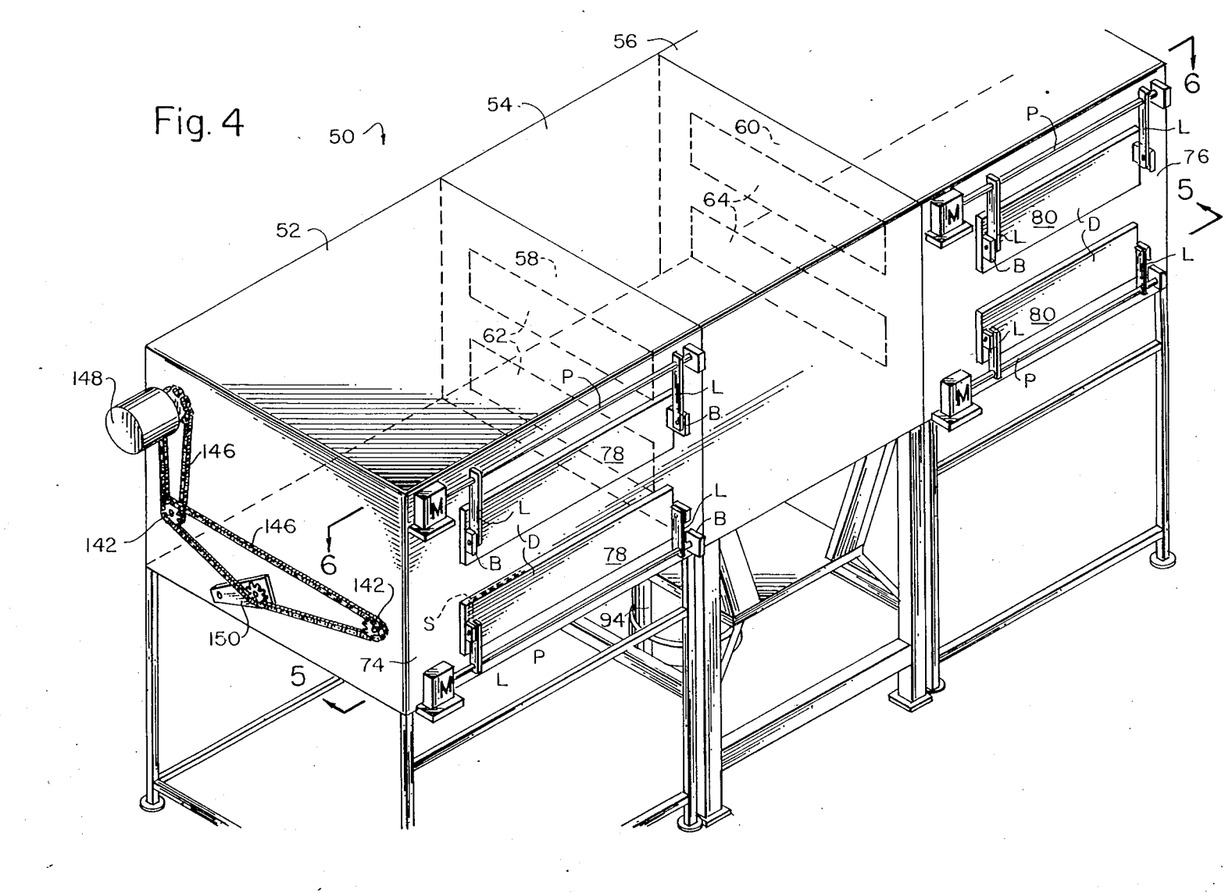
FIG. 4 is a perspective view of the apparatus of the invention comprising a loading chamber, a press chamber, and an unloading chamber.
Figure 5:
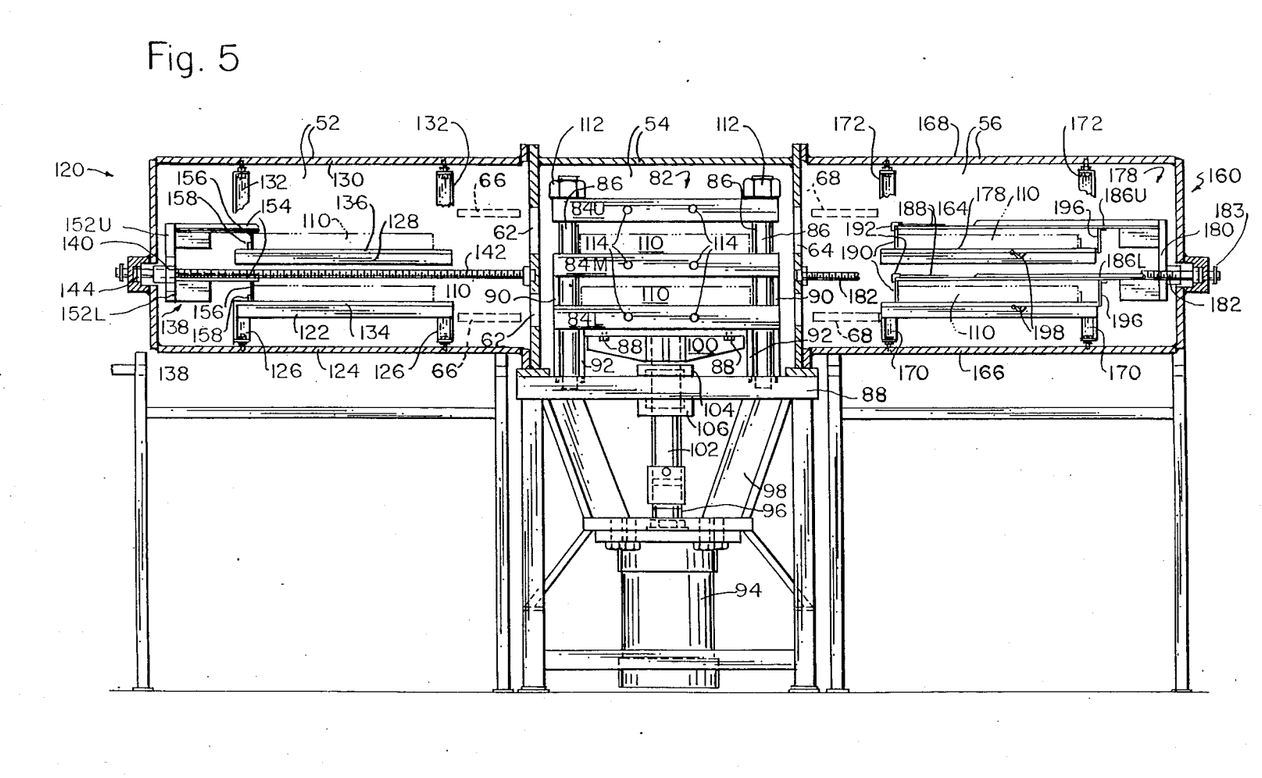
FIG. 5 is an interior front view of the chambers illustrating the transport mechanisms contained in the unloading and loading chambers and the hydraulic press positioned in the press chamber.
Figure 6:
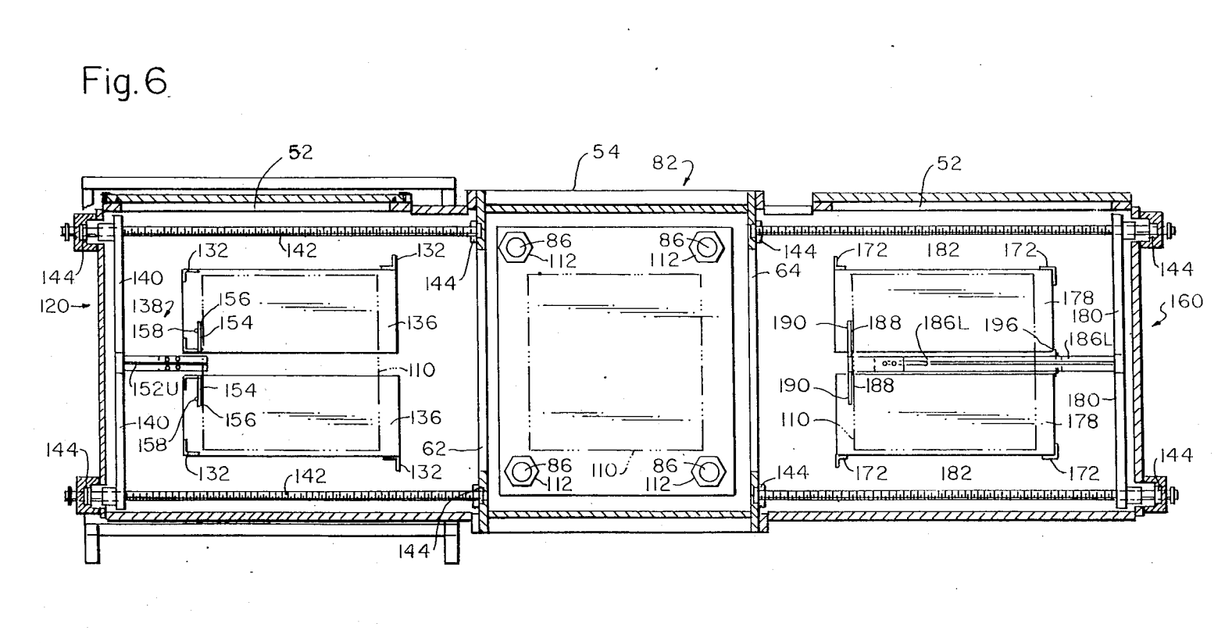
FIG. 6 is an interior top view of the chambers of FIG. 5.

Referring to FIGS. 4-6, the apparatus 50 of the invention comprises a multi-chambered system 50 comprising a loading chamber 52, a press chamber 54, and an unloading chamber 56 serially connected together by means of input intermediate wall 58 and output intermediate wall 60. Upper and lower openings 62 and 64 are provided in the input and output intermediate walls 58 and 60 and are provided with doors 66 and 68, respectively. Likewise, upper and lower openings 70 and 72 are provided in one of the exterior walls 74 and 76 (such as the front walls) of the loading and unloading chambers 52 and 56, respectively. Openings 70 and 72 are also provided with doors 78 and 80, respectively. Each of the doors 66, 68, 78 and 88 comprise a door member D hinged relative to the respective walls (58, 60, 74 and 76) by means of hinge-pin P, brackets B and intermediate link L. Each hinge-pin P is rotated by means of a rotary actuator M to individually open and close the doors 66, 68, 78 and 80. The rotary actuators M are powered by a suitable air supply and controller (not shown). Further, each of the doors 66, 68, 78 and 80 are provided with an O-ring seal S to assure air-tight seal with the respective walls 58, 60, 74 and 76 when closed.

Referring to FIG. 5, a hydraulic press 82 is positioned within the press chamber 54. The hydraulic press 82 comprises an upper fixed platen 84U and a middle and lower vertically movable platens 84M and 84L. The platens 84 are positioned about four guide posts 86 rigidly affixed to the base 88 of the press chamber 54. The middle and lower platens 84M and 84L are slidably positioned about the guide post 86 and are supported in their spaced apart position relative to each other and the upper platen 84L by means of a middle stop 90 and a lower stop 92, respectively.

A hydraulic cylinder 94 having a shaft 96 is supported from the underside of the base 88 by means of a depending base weldment 98. Shaft 96 is operatively connected to a platen weldment 100 by means of an interconnecting rod 102. A pair of caps 104 and 106 are positioned about the rod 102 above and below the base 84. Caps 104 and 106 include O-ring seals or the like to create an air-tight seal between the rod 102 as it slides through the base 88.

The platen weldment 100 is rigidly affixed to the base 84L by the threaded fasteners 88 or the like. During pressurization of the hydraulic cylinder 94, shaft 96 and rod 102 are forced therefrom causing the platen weldment 100 to move upwardly. Having previously placed printed circuit board books 110 into the space between the platens 84, continued upward movement of the platen weldment 100 forces the lower platen 84L against the middle platen 84M with the book 110 sandwiched therebetween. Still further upward movement of the platen weldment 100 forces the lower and middle platens 84L and 84M against the upper platen 84L with its book 110 sandwiched therebetween. Four threaded nuts 112 threadably engage the terminal ends of the guide posts 86 to prevent any upward movement of the upper platen 84U.

The hydraulic press 82 may be operated manually or by computer control. Further, each of the platens 84 may be provided with a heat source, generally indicated by numeral 114 such as electrically resistive, oil or steam heating. The heat source 114 may also be manually or computer controlled to regulate the temperature of each platen 84 during the lamination process. Finally, it is again noted that all of the walls of the press chamber 54 are air-tight to allow the operation of the press to occur in a vacuum. In such a vacuum, ambiant heat loss from the heated platens 84 is almost completely eliminated due to the lack of a heat transfer medium such as air.

An input transport system, generally indicated by the numeral 120, is positioned within the loading chamber 52. The input transfer system 120 functions to transport the books 110 through opening 62 in the press chamber's 54 input intermediate wall 58 and then into the lower and middle platens 84. In the preferred embodiment illustrated, the input transfer system 120 comprises a lower table 122 supported from the floor 124 of the loading chamber 52 by means of corner brackets 126. Similarly, an upper table 128 is supported from the ceiling 130 of the loading chamber 52 by means of depending corner brackets 132. Slides 134 and 136 are respectively positioned on the tables 122 and 128 by means of ball transfers (not shown) which allow the slides 134 and 136 to be slid toward the lower and upper platens 84 of the hydraulic press 82 through openings 62. Hence, slides 134 and 136 function to bridge the gap between the right sides of the tables 122 and 128 and the left edges of the lower and upper platens 84L and 84U.

The input transfer system 120 further comprises a pusher assembly, generally indicated by numeral 138, which functions to push the books 110 positioned on the slides 134 and 136, and the slides themselves, from within the loading chamber 52 into the press chamber 54 thereby causing the books 110 to be positioned on the platens 84. More specifically, pusher assembly 138 comprises a cross-member 140 movable across the interior width of the loading chamber 52 by means of a pair of threaded stocks 142 journaled to the opposing sides of the loading chamber 52 by means of bearings 144. The threaded stocks 142 extend through the left wall of the loading chamber 52 and are sprocketed to be driven by chain 146 and drive motor 148. An idler sprocketed pulley 150 may be provided to maintain tension in the chain 146. The drive motor 148 may be manually or computer controlled to move the cross member 140 back and forth across the interior width of the loading chamber 52.

The pusher assembly 138 still further comprises an upper and lower loading fence 152U and 152L rigidly affixed to the cross member 140. Each fence 152 includes transversely extending arms 154, each having a downwardly depending extension 156. The arms and extensions 154 and 156 are configured to engage the left end of the books 110 placed upon the slides 134 and 136.

During use, drive motor 148 is actuated to move the pusher assembly 138 from the left to the right of the loading chamber 52. During such movement, extensions 156 engage the left ends of the books 110 and the books 110, together with the respective slides 134 and 136, are moved rightwardly until the slides 134 and 136 engage the left end of the platens 84 of the hydraulic press 82. Since the slides 134 and 136 are no longer free to move rightwardly, the books 110 are simply pushed off of the slides 134 and 136 onto the respective platens 84. Reverse operation of a drive motor 148 retracts the pusher assembly 138 from within the press chamber 54 to its original position in the loading chamber 52. Concurrently, downwardly extending extensions 156 engage respective pins 158 affixed to the slides 134 and 136 to return the slides 134 and 136 to their original position on top of the respective tables 122 and 128. Additional books 110 may then be placed on the slides 134 and 136 to repeat the process.

An output transfer system, generally indicated by the numeral 160, is provided for transferring the treated books 110 from within the press chamber 54 into the unloading chamber 56 for unloading. The output transfer system 160 is similar to the input transfer system 120 and includes lower and upper tables 162 and 164 supported from the floor 166 and the ceiling 168 of the unloading chamber 56 by means of suitable brackets 170 and 172, respectively. A slide 176 and 178 is slidably affixed to its respective table 162 and 164 to bridge the gap between the left edge of the table 162 and 164 with the right edge of the lower and middle platens 84L and 84M.

The output transfer system 160 further comprises a puller assembly, generally indicated by numeral 178 to engage and pull the books 110 from within the press chamber 54 into the unloading chamber 56. The puller assembly 178 similarly includes a cross-member 180 operatively connected to a pair of threaded stocks 182 journaled to the opposing sides of the unloading chamber 56 by means of bearings 184. Threaded stocks 182 are driven by a similarly connected drive motor and chain assembly 183. Still further similar to the input transfer system 120, the output transfer system 160 comprises a lower and upper fence 186L and 186U rigidly connected to the cross-member 180. A pair of arms 188 extend transversely from each of the fences 186 and include a downwardly depending extension 190. However, unlike the input transfer system 120, the extensions 190 of the output transfer system 160 are hinged by means of hinge-pin 192 to permit upward movement of the extension 190 in the direction of retraction of the puller assembly 178 as shown by arrow 194. This arrangement allows the extensions 190 to pivot upwardly in a position substantially parallel to the arms 188 such that the arms 188 can move over the books 110 positioned in the press chamber 54. Then, as the extensions 190 move past the left edge of the books 110, extensions 190 fall downwardly to engage the left edge of the books 110 and pull the books 110 from within the press chamber 54 upon retraction of the puller assembly 178.

It is noted that means must be provided to slide the slides 174 and 176 from the tables 162 and 164 to abut against the right edge of the lower and middle platens 84L and 84M and then securing the slides 174 and 176 in such a position until the puller assembly 178 pulls the books 110 from the press chamber 54 fully onto the slides 174 and 176. While many embodiments are feasible, one such embodiment of such means comprises a spring-loaded extension 196 depending from the respective arms 188 in line with the right edge of the slides 174 and 176. Upon extension of the puller assembly 178 in the direction of the press chamber 54, extension 196 engages the right edge of the slides 174 and 176 pushes the slides 174 and 176 until they butt against the right edge of the lower and middle platens 84L and 84M, respectively. Further leftward movement of the puller assembly 178 overcomes the force of the spring-loaded extension 196 thereby forcing the extensions 196 to a retracted position to allow full extension of the puller assembly 178 into the press chamber 54. Concurrently, a spring-loaded catch 198 engages the right edge of the slides 174 and 176 to resiliently secure the slides 174 and 176 in abutment against the platens 84. The tension exerted against the brackets 170 and 172 by the spring-loaded catch 198 is sufficient to secure the slides 174 and 176 in their abutting positions while the puller assembly 178 engages the books 110 on the platens 84 and pulls the same onto the respective sides 174 and 176. Further retraction of the puller assembly 128 overcomes the tension exerted by the catch 198 to force the books 110 and the slides 174 and 176 to the fully retracted position within the unloading chamber 56. The books 110 may then be removed upon opening of doors 80 to complete the procedure.

It is noted that the operation of the doors 60 and 68 in conjunction with the outside doors 78 and 80 of the loading and unloading chambers 52 and 56, respectively, effectively isolates the press chamber 54 and assures that the press chamber 54 will remain evacuated as books 110 are placed in the loading chamber 52 and unloaded from the unloading chamber 56. Hence, as stated above, the significant heat loss will occur within the press chamber 54 thereby assuring repeatably accurate results in treating books 110 of printed circuit boards.

Finally, it is noted that the multi-chambered system 50 of the invention may be supported above the ground by suitable stand, generally indicated by the numeral 200, with all of the support components, such as a vacuum pumps, hydraulic pumps and control panels being positioned therein. Further, it is noted that the entire system 50 may be covered with an esthetically pleasing metal skin with appropriate openings for doors 78 and 80 in the control panels and the control panel.

Figure 7:
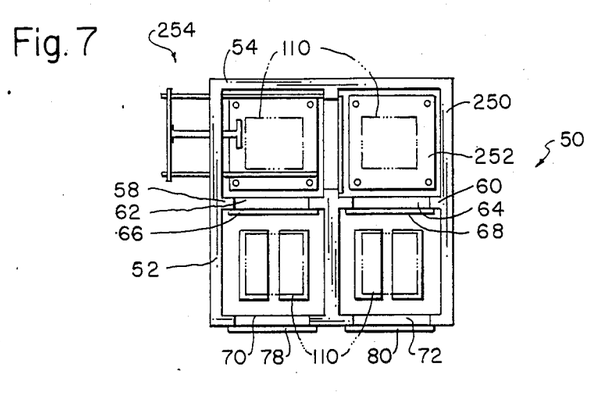
FIG. 7 is a diagrammatical view of an alternative embodiment of the apparatus of the invention as incorporating another press chamber containing another hydraulic press.

Referring not to FIG. 7, the multi-chambered system 50 of the invention may further include an additional press chamber 250 interconnected between the first press chamber 54 and the unloading chamber 56. The second press chamber 250 comprises a hydraulic press 252 of the same character as the hydraulic press 82 of the first press chamber 52, but without any means to heat the platens thereof. Hence, the second hydraulic press 252 in the second press chamber 250 functions as a cold press to cool the books 110 received from the first (heated) press chamber 54 while maintaining pressure on the books 110 during final curing of the epoxy layers of the printed circuit boards thereof. Howevr, both press chambers 54 and 250 remain isolated from atmospheric conditions and contaminants by means of the loading and unloading chambers 52 and 56. Finally, it is also noted that an additional transfer system, generally indicated by the numeral 254 is required to transfer the books 110 from the first press chamber 54 into the second press chamber 250. This additional transfer system 254 may either comprise a pusher assembly, generally indicated by numeral 256, similar to the pusher assembly 138 of the input transfer system 120. Alternatively, the transfer system 254 may comprise a puller assembly (not shown) similar to that of the puller assembly 178 of the output transfer system 160. Finally, the transfer system 254 may include a retractable slide (not shown) to bridge the distance between the platens of the first press chamber 54 with those of the second press chamber 250 allowing the books 110 to be transported from the first press chamber 54 to the second press chamber 250.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and sequence of parts may be resorted to without departing from the spirit of the invention.

Now that the invention has been described, what is claimed is:

1. An apparatus for laminating the layers of a book composed of printed circuit layers and adhesive layers, comprising in combination:
   a loading vacuum chamber, a first press vacuum chamber, and an unloading vacuum chamber serially connected together in such order, adjacent said chambers being isolated from one another by a common wall having an opening therethrough permitting the book to be transported from the preceding to the succeeding adjacent said chambers;
   door means affixed about said opening in said common walls, said door means comprising means for forming an air-tight seal about said openings;
   said loading vacuum chamber and said unloading vacuum chamber each comprising an exterior wall having an opening therethrough;
   a first press having a pair of first platens, said first platens being positioned within said first press vacuum chamber;
   input transfer means for transporting the book loaded in said loading vacuum chamber into said first press vacuum chamber; and
   output transfer means for transporting the book from within said first press vacuum chamber into said unloading vacuum chamber.

2. The apparatus as set forth in claim 1, further including means for heating said first platens of said press.

3. The apparatus as set forth in claim 2, further comprising a second press vacuum chamber interposed between said first press vacuum chamber and said unloading vacuum chamber, a second press having movable second platens positioned within said second press vacuum chamber, and a press transfer means for transporting the book from said first press vacuum chamber into said second press vacuum chamber.

4. The apparatus as set forth in claim 1, wherein said first press comprises a hydraulic press.

5. The apparatus as set forth in claim 3, wherein each said press comprises a hydraulic press.

6. The apparatus as set forth in claim 1, wherein said input transfer means comprises a pusher assembly for pushing the book from said loading vacuum chamber into said first press chamber.

7. The apparatus as set forth in claim 1, wheren said output transfer means comprises a puller assembly for engaging the book within said first press vacuum chamber and pulling the book into said unloading vacuum chamber.

8. The apparatus as set forth in claim 1, wherein said input transfer means comprises a slide slidable to an abutting position with one of said first platens of said first press and means for sliding said slide in said abuting position, to further move a book placed thereon onto the said abutting platen and then to retract said slide into said loading vacuum chamber.

9. The apparatus as set forth in claim 1, wherein said output transfer means comprises a slide slidable to an abutting position with one of said platens of said press and means for sliding said slide in said abutting position, to further move a book on said platen onto said abutting slide, and then to retract said slide, with the book thereon, into said unloading chamber.

* * * * *

UNITED STATES PATENT AND TRADEMARK OFFICE
CERTIFICATE OF CORRECTION

PATENT NO. : 4,689,105

DATED : August 25, 1987

INVENTOR(S) : Fazal A. Fazlin and Asad Ali

It is certified that error appears in the above-identified patent and that said Letters Patent is hereby corrected as shown below:

In column 3, at line 14, please insert --than-- immediately preceding the word "that";

In column 4, at line 31, please delete "with" and insert therefor --within--;

In column 6, at line 18, please delete "appropariate" and insert therefor --appropriate--;

In column 6, at line 22, please delete "generaly" and insert therefor --generally--;

In column 8, at line 9, please delete "84L" at its second occurrence and insert therefor --84U--;

In column 10, at line 27, please delete "the" and insert therefor --no--; and

In column 12, at line 33, please delete "abuting" and insert therefor -abutting--.

Signed and Sealed this

Nineteenth Day of July, 1988

Attest:

DONALD J. QUIGG

*Attesting Officer*  *Commissioner of Patents and Trademarks*